HALL GENERATOR SWITCHING CIRCUITS

Filed June 27, 1961 4 Sheets-Sheet 1

July 5, 1966 H. WEISS 3,259,755

HALL GENERATOR SWITCHING CIRCUITS

Filed June 27, 1961 4 Sheets-Sheet 2

July 5, 1966 H. WEISS 3,259,755

HALL GENERATOR SWITCHING CIRCUITS

Filed June 27, 1961 4 Sheets-Sheet 4

United States Patent Office 3,259,755

Patented July 5, 1966

3,259,755

HALL GENERATOR SWITCHING CIRCUITS

Herbert Weiss, Nurnberg, Germany, assignor to Siemens-Schuckertwerke Aktiengesellschaft, Berlin-Siemensstadt, Germany, a corporation of Germany Filed June 27, 1961, Ser. No. 120,080
Claims priority, application Germany, Aug. 10, 1960, S 69,869
8 Claims. (Cl. 307—88.5)

My invention relates to electronic switching circuits and more particularly to devices in which the switching proper is effected or controlled by electronic semiconductor devices.

Electronic switching operations without mechanical contacts can be performed by employing a magnetic-fiield responsive semiconducting resistor and connecting the load in series with a diode for increasing the steepness of control, i.e. the rate of change in load voltage or current, caused by the magnetic field acting upon the semiconducting resistor. Such a circuit is exemplified in FIG. 1 of the accompanying drawing described below. In circuits of this type the power consumed by the load resistance is considerably smaller than the power taken up by the magneto-resistance member, and a relatively large signal power is required for controlling the switching operation.

Relating to semiconductor circuits generally of the above-mentioned type, it is an object of my invention to improve the abruptness or steepness of the switching performance, i.e. to greatly increase the rate of change imposed upon the voltage or current by means of the switching operation. Another object is to reduce the signal input requirements required for triggering the switching operation.

To this end, and in accordance with my invention, I connect a galvanomagnetic member and a tunnel diode with each other and with the load for jointly switching the current passing from the current supply through the load, the switching being controlled by magnetically responsive change in voltage or current of the galvanomagnetic member.

Tunnel diodes have a current-voltage characteristic which exhibits a negative range between a current maximum at relatively low voltage and a current minimum at higher voltage. For the purposes of my invention, this negative range of the tunnel-diode characteristic is matched to the range of parameter variation effected by the magnetic control of the galvanomagnetic member, namely so that the negative range of the characteristic is located within the range of current change caused by the magnetically responsive galvanomagnetic variation. As a result, such variation causes the load voltage to abruptly switch between two limit values corresponding to respective points near the maximum and minimum respectively of the tunnel-diode characteristic, thus considerably increasing the switching steepness. Depending upon the particular purpose of the load circuit to be controlled, the tunnel diode is either connected in parallel relation to the galvanomagnetic member or in series therewith. Also applicable are combined parallel and series connections of a galvanomagnetic member with two or more tunnel diodes, or of a plurality of such members with one or more tunnel diodes.

The above-mentioned components of a switching circuit according to the invention are known as such. Relative to tunnel diodes, reference may be had, for example, to the article "GaAs Tunnel Diodes" in the German periodical "Zeitschrift für Naturforschung," volume 14*a*, No. 12, pages 1072 and 1073. Reference may also be had to the copending applications Serial No. 72,617, filed November 30, 1960, and Serial No. 90,098 filed February 17, 1961, both assigned to the assignee of the present invention. An example of the current-voltage characteristic of a tunnel diode is also illustrated quantitatively in FIG. 4 of the accompanying drawings described below.

Applicable as galvanomagnetic members are magnetically responsive resistors or Hall generators. Such magneto-resistance members of semiconducting material are known, for example, from Patent 2,894,234. Further reference may be had, for example, to Solid State Physics, edited by F. Seitz and D. Turnbull, Academic Press, Inc., New York, 1956, pages 36 to 39. Such magnetically responsive resistance members may have the shape of straight bars, or of circular discs with one electrode in the center and another electrode around the periphery. Tubular types of such resistance members are described in patent (Serial No. 760,002, filed September 9, 1958). Hall generators (Hall plates), also applicable for the purposes of the present invention provide a variable output voltage dependent upon a magnetic field acting upon the Hall plate. Such Hall generators are known, for example, from Solid State Physics, supra, pages 39 to 42, and Patent 2,852,732.

In the accompanying drawings, the magneto-resistance members are represented by the symbol of a circle with a dot in the center representing the central electrode, and the periphery representing the other electrode. This corresponds to the above-mentioned disc-type devices. It should be understood, however, that the symbol is also intended to represent any other type of magneto-resistance member. Also used in the drawing is the symbol of a Hall plate shown as a rectangular wafer with current supply terminals at the two narrow edges and Hall or probe electrodes in the center of the two long edges respectively (FIG. 6).

The switching circuit may be such that a galvanomagnetic semiconductor member and a tunnel diode are both connected parallel to the load (hereinafter referred to as "load resistance"). For other purposes, however, a galvanomagnetic semiconductor member may be connected in series with a tunnel diode which in turn, is connected parallel to the load resistance. Also applicable are combinations of the just-mentioned two embodiments of the invention. Thus, two magneto-resistance members may be connected in series with each other, and a tunnel diode is connected parallel to one of the two members so as to be series-related to the other member, the load resistance being connected parallel to the tunnel diode. The latter embodiment secures a particularly great rate of voltage change as a result of the switching operation.

According to another feature of my invention, the switching circuit is designed as a tri-stable device. This can be done by connecting two ohmic resistors in series with a magneto-resistance member, and connecting respective tunnel diodes parallel to the two ohmic resistors, the load resistance being connected parallel to the two tunnel diodes.

For further explanation, reference will be made to the accompanying drawings, in which.

Figure 1:
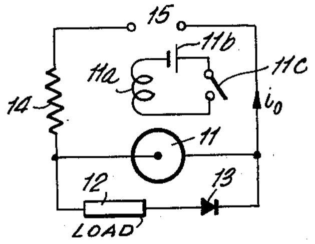
FIG. 1 is the diagram of a switching circuit comprising a magneto-resistance member with a parallel connected diode.

According to FIG. 1, a load 12 is energized from current supply terminals 15 through a series-connected resistor 14 in a switching circuit which comprises a magneto-resistive semiconductor member 11 and a diode 13. The resistance of member 11 is controlled by a magnetic field represented by a winding 11*a* energized from a suitable current source 11*b* under control by a component symbolically illustrated by a switch 11*c* although it will be understood that any other current control means is applicable for this purpose. The total current is denoted by $i_0$. If in a circuit of this type the diode 13 is a rectifier diode poled for conductance in its forward direction, or is a Zener diode of reverse poling, then the rate of load-voltage change resulting from a change in resistance of the galvanomagnetic member 11 is rather small and a relatively large power input in the control circuit of winding 11*a* is required.

Figure 2:
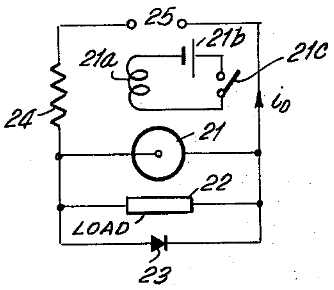
FIG. 2 is the diagram of a switching circuit according to the invention comprising a magneto-resistance member and a tunnel diode, both connected parallel to the load.
Figure 3:
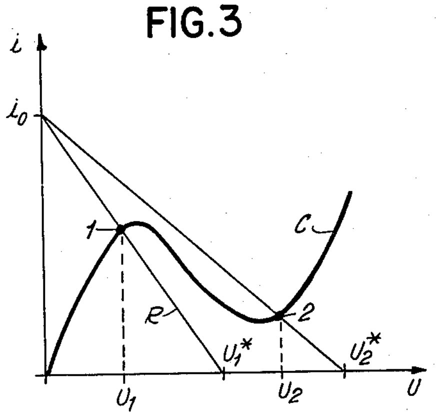
FIGS. 3, 4, 5 are current-voltage diagrams relating to the performance of a switching circuit according to the invention.

FIG. 2 illustrates a comparable switching circuit according to the invention. The magneto-resistive semiconductor member 21 is connected parallel to the load resistance 22 and parallel to a tunnel diode 23. The group of parallel-connected components is energized in series with a resistor 24, from current supply terminals 25. The total current drawn from the current supply is again denoted by $1_0$. The current-voltage conditions are apparent from the qualitative graph of FIG. 3. The abscissa indicates the voltage U. The ordinate indicates the current *i*. The current-voltage characteristic of the tunnel diode 23 is represented by the curve C. The components are so rated that with a relatively small resistance value of the semiconductor member 21, that is when no, or only a weak magnetic field acts upon this member, the load resistance 22 is subjected to the voltage $U_1$. The connecting straight line R through point $i_0$ on the ordinate and point 1 on curve C represents the total resistance constituted by the two resistors 21 and 22. When the resistance of member 21 is increased by increasing the intensity of the magnetic field produced by the field winding 21*a*, the point 1 shifts upwardly on curve C and, after passing beyond the current maximum, jumps to point 2 of curve C. Now the load resistance 22 is subjected to the considerably higher voltage $U_2$. When the magnetic field is reduced, point 2 moves on curve C to the left and, after passing through the minimum, jumps back to point 1. It will be recognized that a relatively slight change in resistance of the magneto-responsive member 21 causes a considerable voltage change to occur at the load resistance 22. Consequently the switching circuit, in the operating range described, has an extreme switching steepness. Without the tunnel diode, the resistance would vary between values, corresponding to the voltages $U'_1$ and $U'_2$. This resistance change is considerably smaller than that occurring between voltages $U_1$ and $U_2$, aside from being considerably less abrupt. The increased change in voltage together with the increased rate of voltage change are important in cases where the switching circuit serves to perform triggering operations such as for the control of relays. Thus, if the load resistance 22 constitutes the coil of an electromagnetic relay, the control of the relay is improved by virtue of the fact that the trigger circuit will reliably operate even if the range between the critical voltages required for opening and closing the relay is relatively large.

Quantitative data for the components of a switching circuit according to the invention are apparent from FIGS. 4, 5, 6 and 7.

Figure 4:
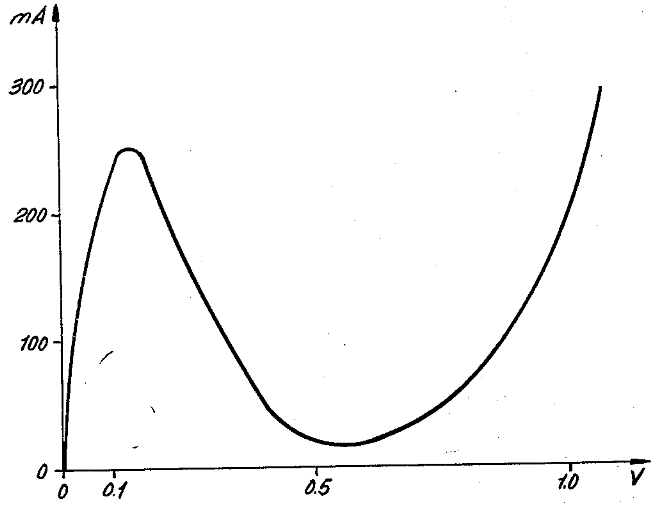
Figures 6, 7, 10, 12:
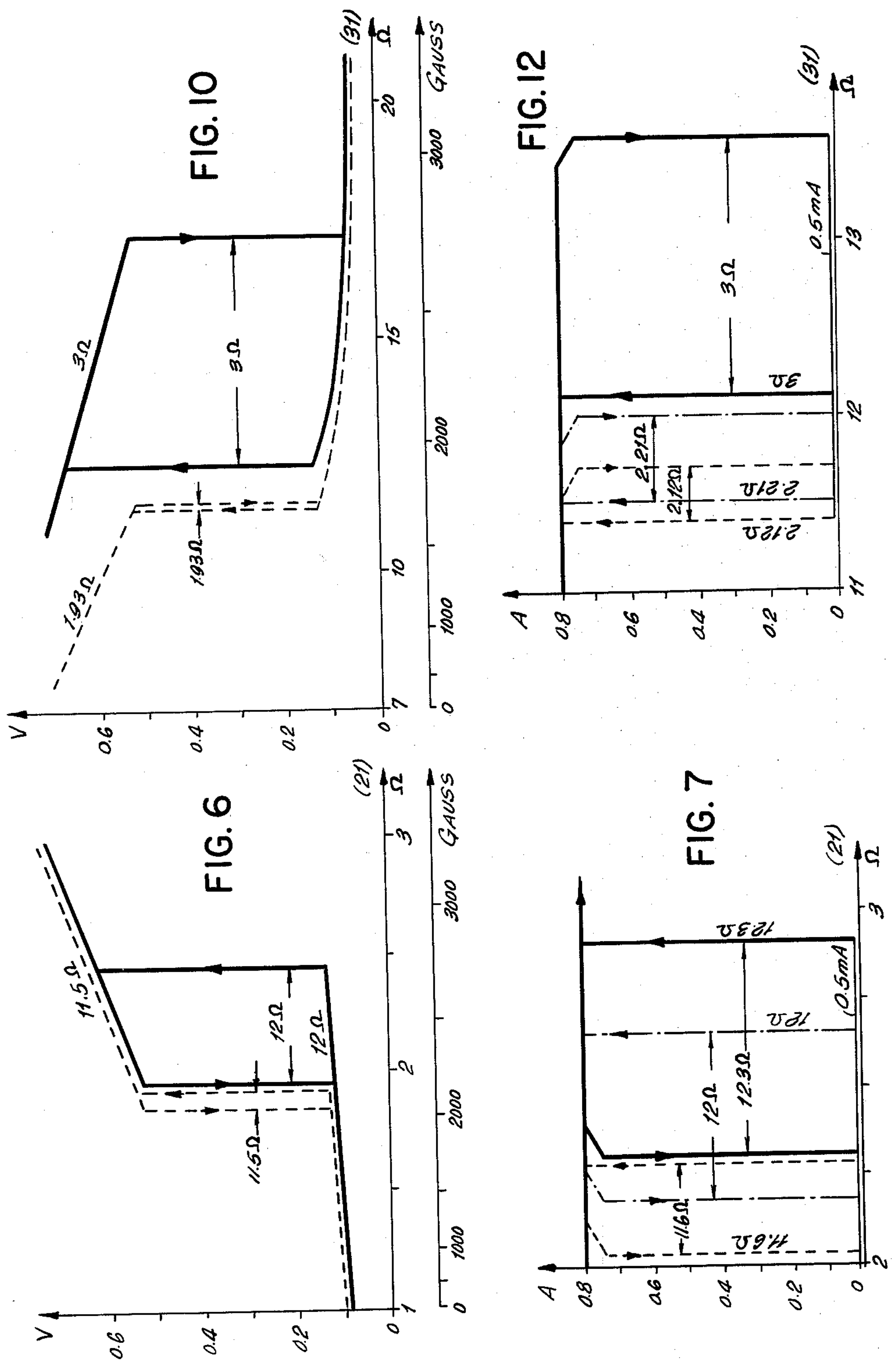
FIG. 6 shows the circuit diagram of another switching circuit according to the invention.
FIG. 7 is an explanatory graph relating to the embodiment of FIG. 6.
FIGS. 9 and 10 are graphs explanatory the operation of the embodiment of FIG. 8.
FIG. 12 is an explanatory graph relating to the embodiment of FIG. 11.

The diagram in FIG. 4 represents the characteristic of gallium arsenide (GaAs) tunnel diodes used in the embodiment of FIG. 2 and also applicable in those described hereinafter. The abscissa in FIG. 4 indicates voltage. The ordinate indicates current in milliamps. The diaram of FIG. 6 shows the course of the voltage at the tunnel diode 23 (FIG. 2) in dependence upon the resistance (in ohm) of the magneto-responsive resistor 21 (upper abscissa), and in dependence upon the magnetic field (in Gauss) acting upon the member 21 (lower abscissa). These data are indicated for two different values of the load resistance 24 in FIG. 2. The diagram of FIG. 6 was taken with a voltage of 3.9 volts applied at the terminals 25. The magneto-resistance member 21 consisted of indium antimonide (InSb) resistance plate as illustrated in FIG. 6 of Patent 2,894,234. The resistance of the plate member, controlled by a magnetic field, had the values indicated on the upper abscissa in FIG. 6. The broken-line curve in FIG. 6 relates to a load resistance 24 of 11.5 ohms, the full-line curve to a load resistance 24 of 12 ohms. For the purpose of plotting the diagram the load resistance 22 in FIG. 2, was constituted by a voltmeter with the aid of which the characteristics of FIG. 6 were determined. This corresponds to the case in which the load resistance is virtually infinite, and hence to a situation in which the switching circuit is practically under no-load conditions.

The example represented by FIG. 6 shows, aside from the switching steepness already mentioned, a pronounced and complete hysteresis-loop characteristic. This affords special uses in cases where heretofore other circuit components with hysteresis characteristic have been used. Thus, for example, a switching circuit according to the invention is applicable as a memory device in control and regulating systems, as will be further explained below. The arrows in FIG. 6 indicate that the width of the hysteresis-loop is greatly dependent upon the magnitude of the series resistor 24 (FIG. 2). Hence the hysteresis characteristic can be controlled and adjusted within a large range with the aid of the series resistor 24.

Figure 5:
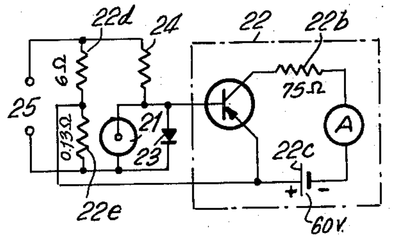

In the embodiment according to FIG. 5, the load resistance 22 of FIG. 2 is substituted by a transistor network. The components 21, 23 and 25 in FIG. 5 possess the same values as mentioned above with reference to FIG. 2. The transistor used was a Siemens transistor, type TF 80/60. The collector circuit, as shown, contained a resistor 22*b* of 75 ohms, a voltage source 22*c* of 60 volt, and a current-measuring instrument A. For adjusting a favorable working point for the transistor, the emitter voltage was tapped off a voltage divider formed of two series-connected resistors 22*d* and 22*e* of 6 ohms and 0.3 ohm respectively. The current-resistance graph in FIG. 7 indicates the collector current of the transistor in dependence upon the resistance of resistor 21 for three parameter values of series resistance 24, the respective resistance parameters being indicated along the appertaining curves in FIG. 7. The abscissa in FIG. 7 indicates the magnetic-field responsive resistance value of member 21 in ohms. The ordinate indicates the collector current of the transistor in amps. This switching circuit, too, exhibits a pronounced hysteresis-loop characteristic whose width increases with the resistance value of the series resistor 24 as will be recognized from the arrows in FIG. 7.

Figure 8:
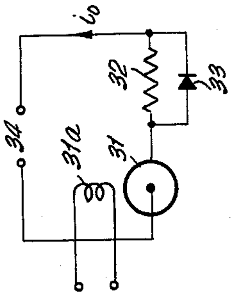
FIG. 8 shows the circuit diagram of still another embodiment.

In the embodiment of the invention shown in FIG. 8, the magneto-resistance member 31 is connected in series with the load resistance 32, and the tunnel diode 33 is connected parallel to the load resistance, the circuit being energized from the current supply terminals 34. The magnetizing field winding for member 31 is shown at 31*a*. The total current is denoted by $i_0$. The current-voltage conditions are apparent from the graph in FIG. 9 which generally corresponds to FIG. 3.

Figure 9:
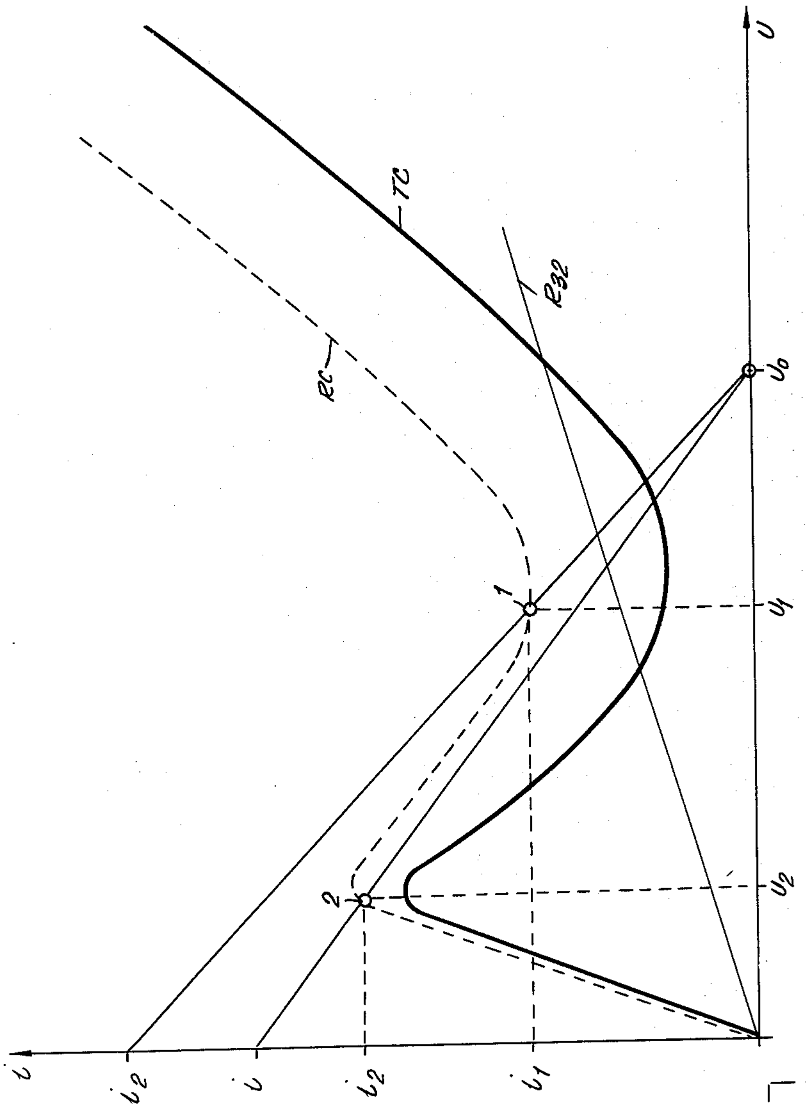

In FIG. 9 the current-voltage characteristic of the tunnel diode 33 (FIG. 8) is denoted by TC and the straight-line characteristic of the load resistor 32 by $R_{32}$. The resulting characteristic RC constitutes the sum of TC and $R_{32}$. When the magnetic field is weak or absent, the current has the value $i_1$. The load resistance 32 is then subjected to the voltage $U_1$. The inclination of the straight connecting line between point 1 and voltage point $U_0$ is determined by the resistance magnitude of the magneto-responsive resistor 31. When the magnetic field acting upon the member 31 becomes more intense, the point 1 shifts on the resultant characteristic RC toward the left to point 2. Now the load resistance 32 is subjected to the relatively small voltage $U_2$. As in the embodiment according to FIG. 2, a relatively great voltage change at the load resistance is obtained with a relatively slight change in resistance of the magneto-resistance member 31. Quantitative data relating to the embodiment of FIG. 8 are apparent from the graph in FIG. 10. The components 33 and 34 had the same data as described above with reference to the embodiment of FIGS. 2 and 6. For obtaining the voltage characteristic at the tunnel diode 33, a voltmeter was provided to serve as the load resistance. The upper abscissa in FIG. 10 indicates the resistance of the magnetically responsive InSb member 31 in ohms. The lower abscissa indicates the correspondingly active magnetic field in Gauss. The ordinate indicates the voltage at the tunnel diode. The broken-line curve in FIG. 10 relates to a resistance value of 1.93 ohms for resistor 32. The full-line curve corresponds to a resistance value of 3 ohms for resistor 32. This characteristic likewise indicates a pronounced hysteresis greatly dependent upon the resistance magnitude of the load resistance 32. In this case, therefore, the load resistance 32 may serve as an adjusting resistor for setting the working range of the switching circuit.

Figure 11:
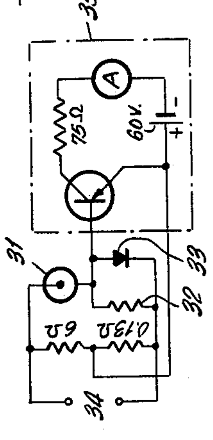
FIG. 11 shows the circuit diagram of a further embodiment.

The embodiment illustrated in FIG. 11 is similar to that described above with reference to FIG. 5, except that the transistor circuit 35, constituting the load resistance, is connected in series with the magneto-resistor 31 and generally in parallel to the tunnel diode 33. The components of the transistor circuit 35 correspond to those shown in FIG. 5. If they have the same rating, the performance is essentially as described above with reference to FIG. 7.

Figure 13:
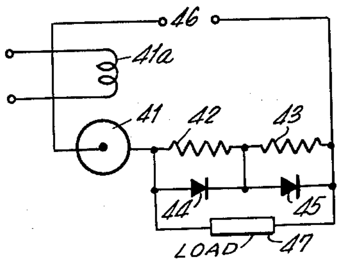
FIG. 13 shows the diagram of a tri-stable switching circuit according to the invention.
Figure 14:
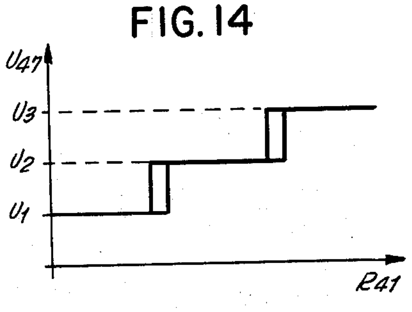
FIG. 14 is an explanatory graph for the embodiment of FIG. 13.

The embodiment shown in FIG. 13 constitutes a tri-stable switching circuit. It comprises a magneto-resistive member 41 with an appertaining control coil 41*a*, two ohmic resistors 42 and 43, two tunnel diodes 44 and 45, and a load resistance 47 to be energized from current-supply terminals 46. The two tunnel diodes 44 and 45 have a somewhat different characteristic. This has the consequence that, when the resistance of member 41 is changed by changing the energization of the field coil 41*a*, the voltages at the two tunnel diodes perform the above-mentioned voltage jump at respectively different resistance values. A typical resulting voltage-resistance characteristic is represented in FIG. 14, showing the voltage $U_{47}$ at load resistance 47 versus the resistance $R_{41}$ of the magneto-responsive member 41. The characteristic of FIG. 14 indicates three "stable" voltages $U_1$, $U_2$, $U_3$ and two hysteresis-loops. The resistors 42 and 43 in FIG. 13 may also be designed as magneto-responsive resistors and may then be subjected to the same magnetic field as the member 41. This results in a further increase in switching steepness.

Figure 15:
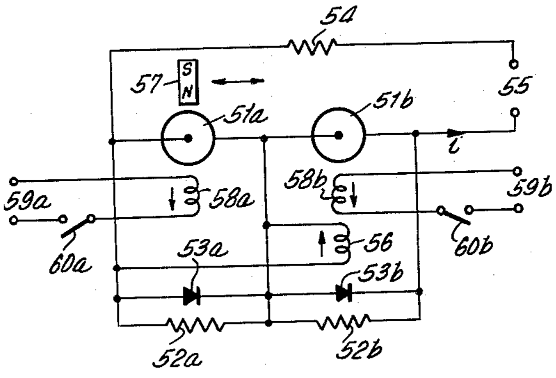
FIGS. 15, 16 and 17 illustrate schematically three further embodiments of switching circuits according to the invention.

In the embodiment of FIG. 15, two switching circuits of the type shown in FIG. 2 are coupled with each other. Denoted by 51*a* and 51*b* are respective magneto-responsive resistors which are connected in parallel relation to respective load resistances 52*a* and 52*b*. Also connected in parallel to the load resistances are respective tunnel diodes 53*a* and 53*b*. The load resistances are energized from current-supply terminals 55 through a series resistor 54. The member 51*b* is subjected to the field of an electhromagnet whose coil 56 is connected parallel to the magneto-responsive resistance member 51*a*. The device comprises a permanent magnet 57 which is mechanically displaceable to act sequentially upon the resistance members 51*a* and 51*b* as it passes by these members. The magneto-resistance members 51*a* and 51*b* are further subject to the magnetic field of two electromagnets whose windings 58*a* and 58*b* are energized from respective voltage sources at 59*a* and 59*b* under control by normally open switches 60*a* and 60*b* respectively. The components are so dimensioned that the following performance will result.

When the permanent magnet 57 acts upon the resistance member 51*a*, the load resistance 52*a* receives a voltage which corresponds to a stable condition. When the magnet 57 is moved out of its active range relative to member 51*a*, this stable voltage condition for load resistance 52*a* remains preserved. The magnetic field acting upon resistance member 51*b* by the action of the winding 56 is not alone sufficient for switching the tunnel diode 53*b* to the corresponding stable condition. This takes place only when the field of the permanent magnet 57 is added to the field of winding 56. On the other hand, the field of the permanent magnet 57 is likewise not alone sufficient to switch the tunnel diode 53*b* to this condition. By closing the switches 60*a* and 60*b* the respective windings 58*a* and 58*b* are energized in opposition to the previously active magnetic fields for switching the system back to the starting condition.

A system of this type is suitable, for example, for the control of forward and return motions as occurring in machine tools and other fabricating or conveying machinery. In this case, the permanent magnet 57 is firmly joined with the travelling part of the equipment. Of course, if desired, the permanent magnet may be fixed whereas the other portion of the system is joined with the travelling part to move together therewith. A particular application for such a system is the control of elevators and other hoists where the following performance is obtained.

When the permanent magnet 57 is located before the resistance member 51*a*, the load resistance 52*a*, forming part the hoist-control circuits, acts to reduce the operating speed braking (signal). When subsequently the travelling permanent magnet 57 reaches the vicinity of the resistance member 51*b*, the hoist is stopped (stopping signal) by action of the load resistance 52 which serves to switch the hoist drive on and off, for example by means of a relay. However, when the hoist is neither to be slowed down nor to be stopped, then the switches 60*a* and 60*b* are closed. The counteracting magnetic field then produced by the windings 58*a* and 58*b* put the above-described braking and stopping mechanism out of action. By coupling a number of switching circuits according to the invention, additional function can be carried out in an analogous manner.

Figure 16:
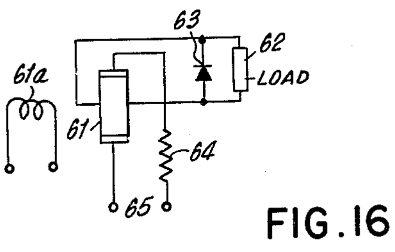

The embodiment shown in FIG. 16 corresponds in principle to that of FIG. 2, except that the galvanomagnetic member consists of a Hall generator. The semiconducting Hall plate, for example of indium antimonide or indium arsenide (InSb, InAs), is denoted by 61. The Hall plate 61 is subjected to the controllable magnetic field of an electromagnet whose coil is denoted by 61*a*. The Hall plate is connected to current supply terminals 65 in series with a resistor 64. The two Hall electrodes of the plate are connected to a load resistance 62 in parallel relation to a tunnel diode 63. The switching circuit operates essentially in the same manner as the one described above with reference to FIG. 2. It will be understood that the embodiments illustrated in FIGS. 5, 8 etc.

can be modified analogously by using Hall generators as galvanomagnetic devices.

By virtue of the improved properties described above with reference to the illustrated examples, switching circuits according to the invention are amenable to numerous applications for control and regulating purposes. Aside from their use as a bistable switching device, the circuits according to the invention are emanently suitable, for example, for logic operations in control and regulating systems, such as those described in principle and with respect to several practical applications in the October, 1959 issue of the German periodical Siemens-Zeitschrift, or in the corresponding English-language publication Siemens Review, vol. XXVII, 1960, No. 3, both publications relating to systems made and sold by the assignee of the present invention under the trade name Simatic. For such purposes, the switching circuit according to the invention is preferably designed as a single structural unit. As a rule, the input or control signals for this unit are supplied to the circuit of one or more of the electromagnetic excitation coils that act upon the galvanomagnetic members in the manner explained above. The output circuit of such a unit may be formed by tap leads connected to the tunnel diode or by the corresponding Hall-electrode leads.

In a switching unit, particularly for controlling, regulating or logic purposes of the last-mentioned type, the input circuits are galvanically isolated from the output circuits, as will be recognized for example from FIG. 2 where the input circuit of winding 21a is isolated from the load circuit. For that reason, any number of switching units according to the invention can readily be connected together without mutual interference. Furthermore, the output power can be made considerably greater than the input power. With the parameter ratings mentioned above by way of example, the switching circuits are sufficient to provide the output power needed for switching of power transistors from one to the other limit condition.

Figure 17:
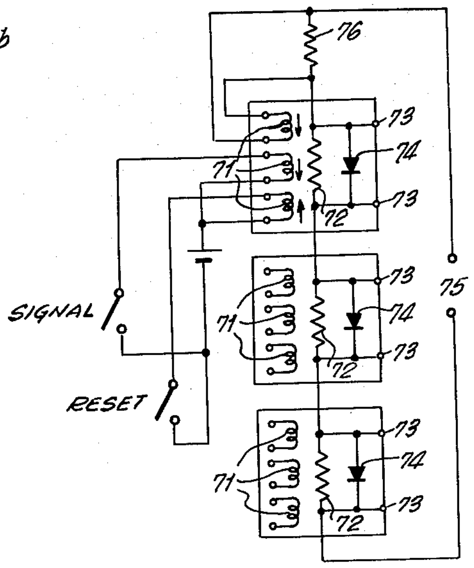

A number of such switching units according to the invention may further be connected in series with each other to a common current supply. This is schematically illustrated in FIG. 17 for three switching units. The input circuit of each individual switching unit is constituted by three magnetic field windings 71. These field windings form part of electromagnets acting upon the magneto-responsive resistance member 72 of the respective units. Each unit has two output terminals denoted by 73 and is provided with a tunnel diode 74. All three units are connected to the same pair of current supply terminals 75 in series with a single resistor 76. The voltage drop of resistor 76 is utilized for premagnetizing one input coil 71 in the first-stage unit. Such feedback premagnetization can be used for performing an OR-gate function, as mentioned for example in the above-mentioned literature. The premagnetization may also be effected with the aid of a permanent magnet.

For performing an AND-gate function, the switching unit is so dimensioned electrically that the output signal at terminals 73 will appear only if all input circuits, or a predetermined number thereof, receive respective signals. In this case, no premagnetization is employed. The use of switching units according to the invention for performing a memory function, also mentioned in the above-cited literature, is based upon the same principle as the known memory elements operating with magnetic hysteresis. This can be carried out in practice by connecting the output circuit of the switching unit directly with the input circuit. Another input circuit with an appertaining magnetizing winding then serves for clearing or eliminating a signal. Another possibility of performing a memorizing function is to dimension the components so that the magnetically responsive resistance member, without the presence of an input signal, possesses a resistance value greater than the negative resistance of the tunnel diode. Then the output signal remains preserved after the input signal is terminated. The output signal can then be cleared by another input signal applied to a magnetizing winding whose polarity is opposed to that of the one used for the original input signal. Such a memory circuit is obtained, for example, with a switching circuit having a characteristic according to FIG. 6, if the working point of the switching circuit is placed into the middle of the hysteresis-loop by corresponding premagnetization.

Such and other modifications and applications of switching circuits according to the invention will be obvious to those skilled in the art. Hence it will be understood that my invention can be embodied in devices other than particularly illustrated and described herein, without departing from the essential features of my invention and within the scope of the claims annexed hereto.

I claim:

1. Electronic switching circuit, comprising current supply means, a load connected to said supply means, galvanomagnetic member means and tunnel diode means connected with each other and with said load for jointly switching the current passing from said supply means through said load, said member means having controllable magnetic field means for controlling the switching operation by galvanomagnetic variation of said member means, said tunnel diode means having a current-voltage characteristic with a negative range between a current maximum at relatively low voltage and a current minimum at higher voltage, said negative range being matched to the range of said galvanomagnetic variation so as to be located within the range of diode-current change due to said variation, whereby said variation causes the load voltage to switch between two limit values corresponding to respective points near said maximum and minimum respectively of said tunnel-diode characteristic.

2. Electronic switching circuit, comprising current supply means, load connected to said supply means, a magneto-resisitive semiconductor member means and tunnel diode means connected with each other and with said load for jointly switching the current passing from said supply means through said load, said member means having controllable magnetic field means for controlling the switching operation by magnetic variation in ohmic resistance of said member means, said tunnel diode means having a current-voltage characteristic with a negative range between a current maximum at relatively low voltage and a current minimum at higher voltage, said negative range being matched to the range of said resistance variation so as to be located within the range of current change due to said variation, whereby said resistance variation causes the load voltage to switch between two limit values corresponding to respective points near said maximum and minimum respectively of said tunnel-diode characteristic.

3. An electronic switching circuit according to claim 1, wherein said galvanomagnetic member means is a Hall-voltage generator having a semiconductor Hall plate with current supply terminals and Hall electrodes, said current supply terminals are connected to said current supply means, and said tunnel diode means and load are connected to said Hall electrodes.

4. An electronic switching circuit according to claim 1 wherein said galvanomagnetic member means and said tunnel diode means are connected in parallel with said load.

5. An electronic switching circuit according to claim 1 wherein said galvanomagnetic member means and said tunnel diode means are connected in series with each other, and said load is connected in parallel to said tunnel diode means.

6. An electronic switching circuit according to claim 1, wherein said galvanomagnetic member means, comprises two members connected in series with each other, said tunnel diode means are connected in series relation to one of said members and in parallel relation to the other member, and said load is connected in parallel to said tunnel diode means.

7. An electronic switching circuit according to claim 1 wherein said tunnel diode means comprises two tunnel diodes and two ohmic resistors, said galvanomagnetic member means are connected in series with said two resistors, said two tunnel diodes are connected in parallel to said respective resistors, and said load is connected in parallel to said two tunnel diodes, said two tunnel diodes having respectively different current-voltage characteristics for tri-stable operation of the switching circuit.

8. An electronic switching circuit according to claim 1 wherein said tunnel diode means comprises two tunnel diodes, said two tunnel diodes being interconnected for joint coaction with said galvanomagnetic member means and having the respective negative ranges of their current-voltage characteristic differently related to said range of galvanomagnetic change so as to perform tri-stable switching operations.

No references cited.

ARTHUR GAUSS, *Primary Examiner.*

HERMAN KARL SAALBACH, *Examiner.*

M. LEE, J. JORDAN, *Assistant Examiners.*